(12) United States Patent
Verplaetse et al.

(10) Patent No.: US 8,848,373 B2
(45) Date of Patent: Sep. 30, 2014

(54) HEAT SINK FOR AN ELECTRONIC OR ELECTRICAL COMPONENT

(75) Inventors: Daniel Verplaetse, Thuin (BE); Nicolas Konstantatos, Thuillies (BE); Franz Molle, Strepy-bracquegnies (BE)

(73) Assignees: Daniel Verplaetse, Thuin (BE); Nicolas Konstantatos, Thuillies (BE)

( * ) Notice: Subject to any disclaimer, the term of this patent is extended or adjusted under 35 U.S.C. 154(b) by 439 days.

(21) Appl. No.: 13/383,790

(22) PCT Filed: Jul. 8, 2010

(86) PCT No.: PCT/EP2010/059782
§ 371 (c)(1),
(2), (4) Date: Jan. 12, 2012

(87) PCT Pub. No.: WO2011/006819
PCT Pub. Date: Jan. 20, 2011

(65) Prior Publication Data
US 2012/0113597 A1 May 10, 2012

(30) Foreign Application Priority Data
Jul. 14, 2009 (BE) .................... 2009/0429

(51) Int. Cl.
*H05K 7/20* (2006.01)
*F28F 13/00* (2006.01)
*H01L 23/367* (2006.01)
*F21V 29/00* (2006.01)
*F21V 19/00* (2006.01)
*F21Y 101/02* (2006.01)

(52) U.S. Cl.
CPC ............. *H01L 23/3672* (2013.01); *F28F 13/00* (2013.01); *H05K 7/2039* (2013.01); *F21V 29/2225* (2013.01); *F21V 29/246* (2013.01); *F21V 19/005* (2013.01); *F21Y 2101/02* (2013.01)
USPC ........... 361/709; 165/80.3; 165/185; 361/704

(58) Field of Classification Search
CPC ... H05K 7/20; H05K 7/20154; H05K 7/2039; F28F 13/00; H01L 23/3672
USPC ...................................................... 361/709
See application file for complete search history.

(56) References Cited

U.S. PATENT DOCUMENTS

| | | | | |
|---|---|---|---|---|
| 4,899,210 A | * | 2/1990 | Lorenzetti et al. ............ | 257/712 |
| 7,182,126 B2 | * | 2/2007 | Heise ............................ | 165/142 |

(Continued)

OTHER PUBLICATIONS

PCT International Search Report issued in connection with PCT/EP2010/059782 on Sep. 2, 2010.

*Primary Examiner* — Gregory Thompson
(74) *Attorney, Agent, or Firm* — Kevin R. Erdman; Brannon Sowers & Cracraft PC

(57) ABSTRACT

The invention relates to a heat sink (1) for an electronic or electrical component, including: a base element (2) including a first main surface (2a) suitable for receiving the electronic component in close thermal contact; a plurality of elongate fins (3) projecting outwards from the second main surface (2b) of the base element (2), opposite the first surface (2a), and arranged around the entire periphery of the case element with enough space between fins to allow air circulation, characterized in that said space can be obtained by cutting a star-shaped geometrical shape matching said base element and said fins in a thin plate; and folding the fins relative to the plane of the base element.

20 Claims, 9 Drawing Sheets

(56) References Cited

U.S. PATENT DOCUMENTS

| | | | |
|---|---|---|---|
| 8,167,466 B2* | 5/2012 | Liu | 362/373 |
| 2001/0037571 A1 | 11/2001 | Horng | |
| 2004/0035554 A1* | 2/2004 | Sato et al. | 165/80.3 |
| 2005/0168944 A1* | 8/2005 | Chen | 361/695 |
| 2007/0206357 A1 | 9/2007 | Hellinger | |
| 2009/0154103 A1* | 6/2009 | Liu | 361/700 |
| 2010/0124020 A1* | 5/2010 | Lin | 361/697 |
| 2010/0154788 A1* | 6/2010 | Wells et al. | 126/658 |

* cited by examiner (a) Prior art "OSRAM"

(b) INV

HEAT SINK FOR AN ELECTRONIC OR ELECTRICAL COMPONENT

CROSS-REFERENCE TO RELATED APPLICATIONS

This application is the U.S. national phase of PCT/EP2010/059782 filed Jul. 8, 2010. PCT/EP2010/059782 claims the benefit under the Convention of Belgian Patent Application No. 2009/0429 filed on Jul. 14, 2009, the disclosures of which are explicitly incorporated by reference herein.

FIELD OF THE INVENTION

The invention relates to a heat sink for an electrical or electronic component that is particularly efficient, easy and inexpensive to produce. It may be used for any types of electronic components, such as for example, microprocessors or LED lights, and electrical components, such as for example, transformers or current variators.

TECHNOLOGICAL BACKGROUND

There are numerous electronic components in increasingly numerous fields. Obviously, we are referring to microprocessors in machines or computers, but also semiconductors used in lights, commonly known as LEDs (Light Emitting Diodes). All these electronic components have the generation of heat during the use thereof in common. Unfortunately, the efficiency and service life thereof are closely dependent on the temperature (some authors apply Arrhenius's law to model the temperature dependency of the service life of an LED spotlight). The heat generated by the operation thereof thus reduces the performances thereof. For this reason, it is necessary to discharge the heat generated by these electronic components. The aim may be achieved by dynamic means, using, for example, a fan, a heat exchanger, or by passive means, for example using a radiator, also known as a heat dissipater or heat sink, these expressions considered to be synonymous herein.

Numerous heat sink models are available on the market. They all have the common features of elements consisting of high heat conduction materials, such as aluminium, tungsten, titanium, or copper, placed in thermal contact with the electronic component from which the heat is to be discharged, and a having a geometry suitable for discharging said heat at a distance from the component. For example, it is possible to cite heat sinks comprising a base element whereon the electronic component is attached and elements arranged radially about said base element enabling the discharge of the heat to an outer ring concentric with respect to the base element. Such devices are described for example in U.S. Pat. No. 7,153,004 and WO2006/118457.

To remedy excessive radial bulkiness problems, further heat sinks comprise fins or shafts extending outside the plane of the base element, discharging the heat to the rear of the electronic component. The fins may be arranged about the perimeter of the base element, as in WO2008/135927, or arranged on the entire surface area of the base element as in US2007/0036161, U.S. Pat. No. 7,108,055, U.S. Pat. No. 6,826,050, WO2006/017301, and WO2008/005833. The shape of the fins varies from a mere triangle to three-dimension geometries. In US2005/0257914, the base element is connected to a hollow body extending on a normal plane with respect to the first, whereon fins are attached.

The heat sinks reviewed above are of variable complexity and efficiency but all require costly or long implementation means. Indeed, they are either cast in a mould in one piece, or extruded, or alternatively, require the assembly of various parts. U.S. Pat. No. 5,660,461 describes a heat sink consisting of individual elements intended to be assembled to form a matrix suitable for discharging the heat from an LED unit. In one alternative embodiment, each individual element of said heat sink is formed by cutting out a metal strip and bending same in a U-shape, thus forming two fins connected to a base element. The U-shapes are then assembled into strips, or into matrices. Here again, significant manual work is involved and said heat sinks only apply to specific products comprising a multitude of LEDs.

Therefore, there remains a need for heat sinks for electronic components suitable for keeping the temperature of the electronic component at the lowest possible levels, and which are easy and inexpensive to manufacture in varied geometric configurations and quantities.

SUMMARY OF THE INVENTION

The present invention is defined in the independent claims attached. Preferred alternative embodiments are defined in the dependent claims. The present invention relates to a heat sink for an electronic or electrical component, comprising:
  a base element, which is preferably flat, comprising a first main surface suitable for receiving the electronic or electrical component in close thermal contact;
  a plurality of elongate fins projecting outwards from the second main surface of the base element, opposite the first surface, and arranged around the entire periphery of the base element with enough space between fins to allow air circulation, the fins being further arranged according to at least two concentric regular geometric figures with the main surfaces thereof secant or substantially tangent with respect to said figures, and the fins having a trapezoidal shape wherein the short side is in contact with said base element.

Said heat sink is obtained by
  cutting a geometric shape corresponding to said flat base element and said fins in a thin plate; and by
  bending the fins relative to the plane of the base element.

The invention also relates to a method for manufacturing a heat sink for electronic components, comprising the following steps:
  cutting a geometric shape corresponding to a base element and a plurality of elongate fins having a trapezoidal shape wherein the short side is in contact with said base element in a thin plate;
  bending the fins outside the plane of the plate, such that the fins are arranged according to at least two concentric regular geometric figures around the entire periphery of the base element with enough space between fins to allow air circulation.

The term trapezoidal fin according to the invention refers to any fin shape comprising a substantially trapezoidal geometric figure wherein the short side is in contact with said base element.

The trapezoidal fin is thus wider as the height of said figure increases and the difference in temperature ($\Delta T$) between air and the fin decreases to ensure substantially constant heat dissipation along the entire height of said figure. The shape of the fin thus helps maximise the heat dissipation per unit of volume of the heat sink.

The exchange surface area and thus the cooling effect of the heat sink according to the invention are maximised both by a sufficient number of fins and by the large surface area of each trapezoidal fin.

Due to the shape thereof, the fins may be cut from a thin plate in a particularly large number if the surfaces thereof in contact with the base element are advantageously situated on curved regular geometric figures such as ellipses or circles.

Again due to the particular shape thereof and the number thereof, two adjacent fins can only be bent (along the same angle) without partially overlapping, if the surfaces of said fins in contact with the base element are offset on concentric regular figures after the successive or sequential bending thereof.

The present invention is particularly useful in the field of light-emitting diodes, or LEDs, and in microprocessors used in computers or machines. In general, a heat sink according to the present invention makes it possible to maintain the temperature of an electronic component, such as a semiconductor, at lower levels than those permitted by the majority of commercial heat sinks, increasing the service life of said component substantially.

BRIEF DESCRIPTION OF THE FIGURES

These aspects and further aspects of the invention will be clarified in the detailed description of particular embodiments of the invention, with reference to the figures, wherein.

DETAILED DESCRIPTION OF PARTICULAR EMBODIMENTS

FIGS. 1a to g shows various views of a heat sink according to the present invention at various successive stages of the production thereof. The principle of the production thereof is extremely simple since it is simply necessary to obtain a thin plate made of conductive material, such as aluminium, copper, tungsten or titanium or other metals or alloys, and obtain, as in FIG. 1a, a geometry comprising a central portion defining a base element 2 of the heat sink, from which fins 3 forming a star shape, the geometry whereof is dependent on the desired heat sink configuration, project. This figure also represents two concentric circles 4' and 4" whereby the fins 3 will be bent at a later stage, the circle 4" being situated outside the first. A thin plate suitable for the present invention is easily and inexpensively commercially available and is produced for example by rolling. Said plate may exhibit on the surfaces thereof textures such as blisters, grooves, gouges, guilloche patterns, projections, protuberances, etc. to increase the fin exchange surface area. The "star" shape of the plate may be obtained by any means well known to those skilled in the art, including for example, stamping, laser cutting or photochemical machining. Laser cutting is particularly preferred for small production runs, where the geometry of the star may be subject to regular changes.

Figure 1A:
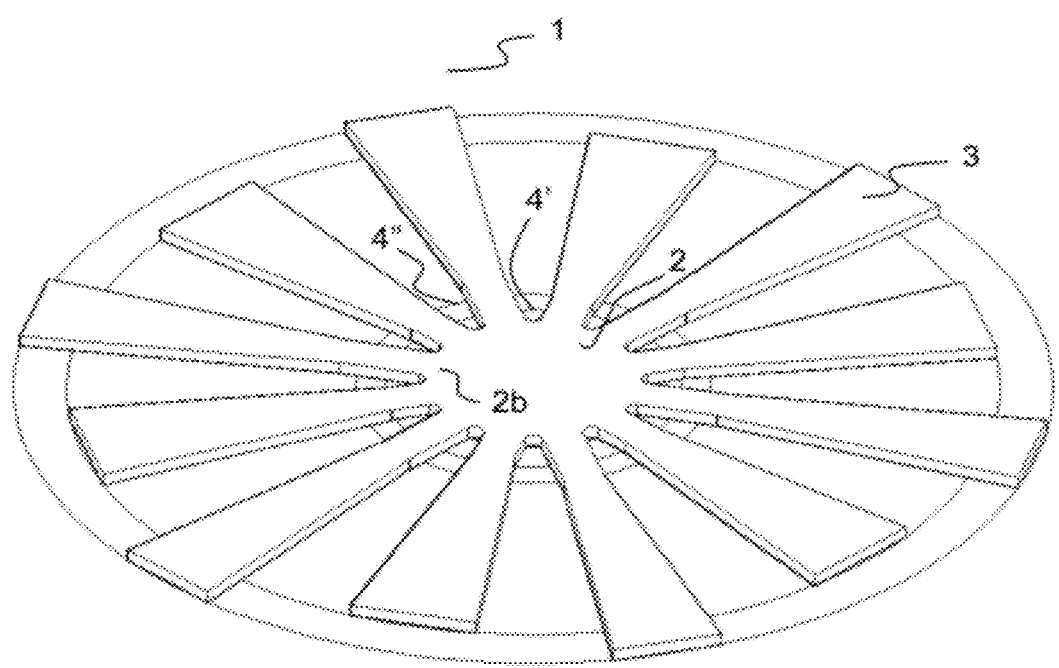
FIG. 1(a) to (h) shows a heat sink according to the present invention, at various stages of the production thereof from the deployed state prior to bending to the final configuration thereof after bending with top and bottom views, in perspective or not.
Figures 1B, 1C:
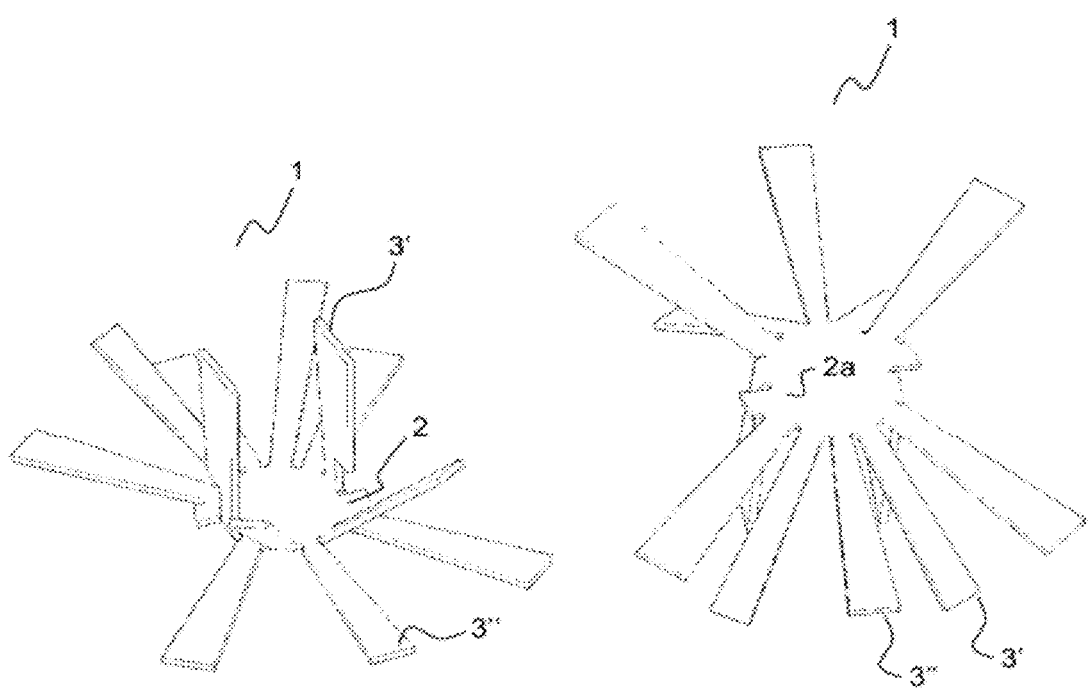
Figure 1:
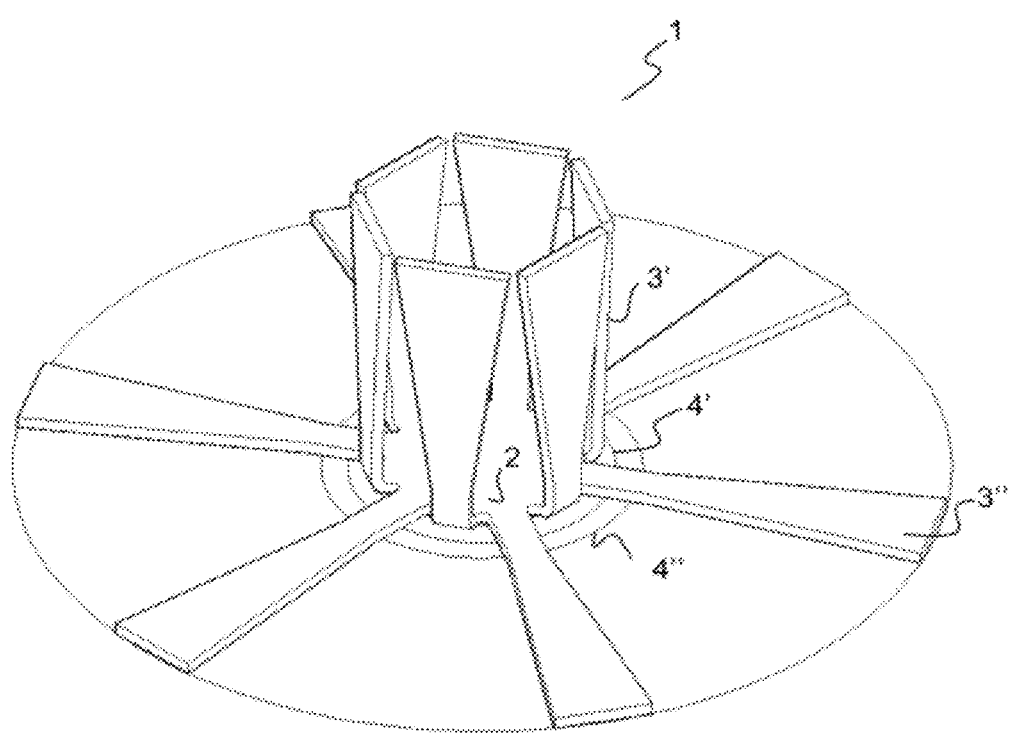
Figure 1:
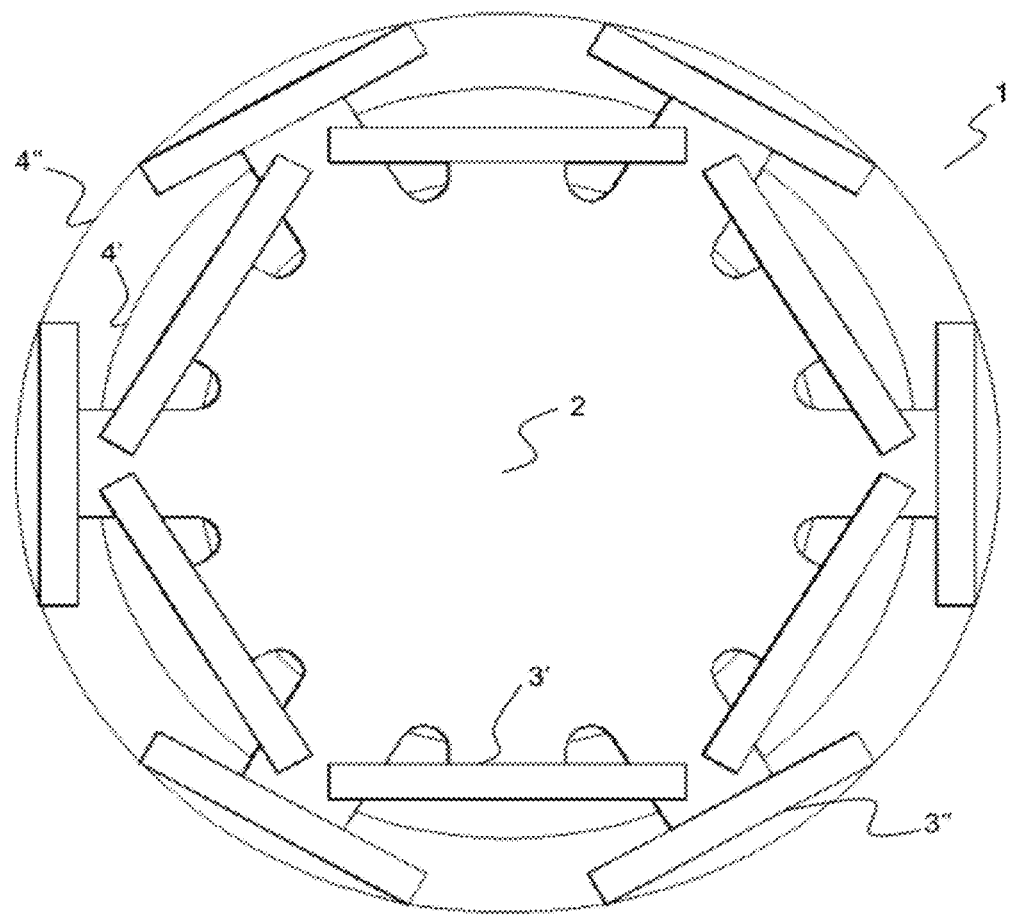
Figure 1F:
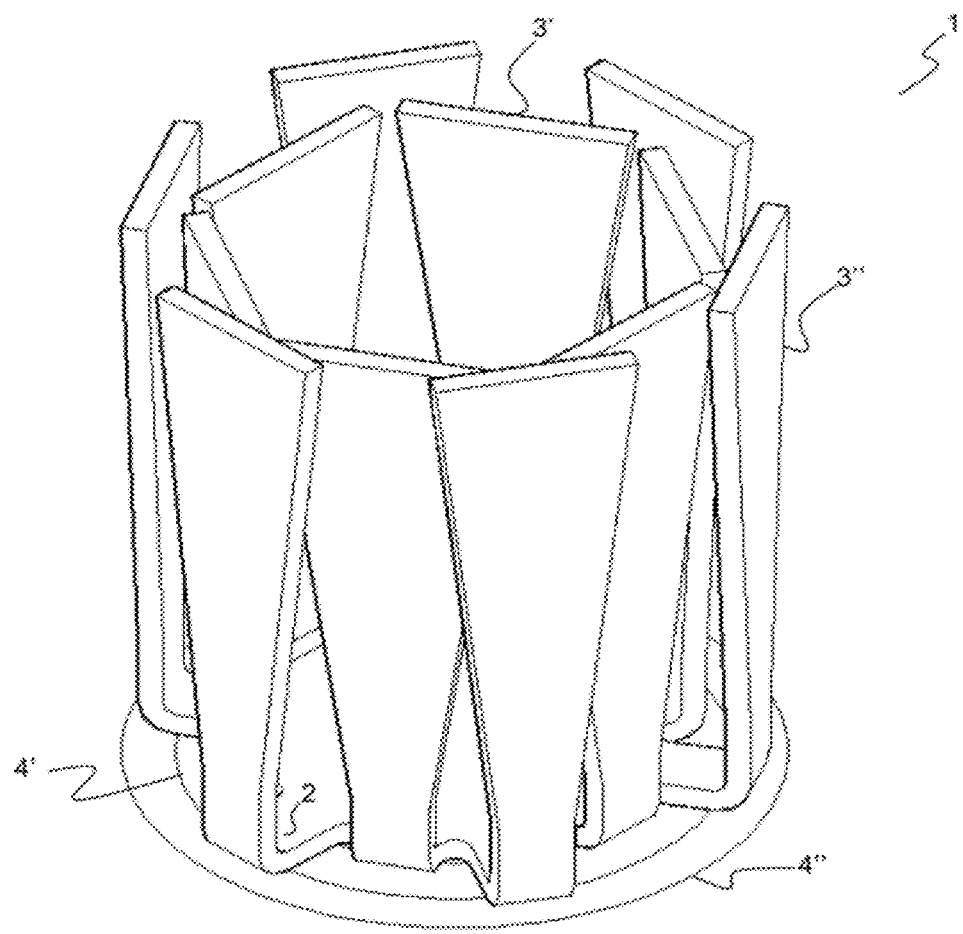
Figure 1G:
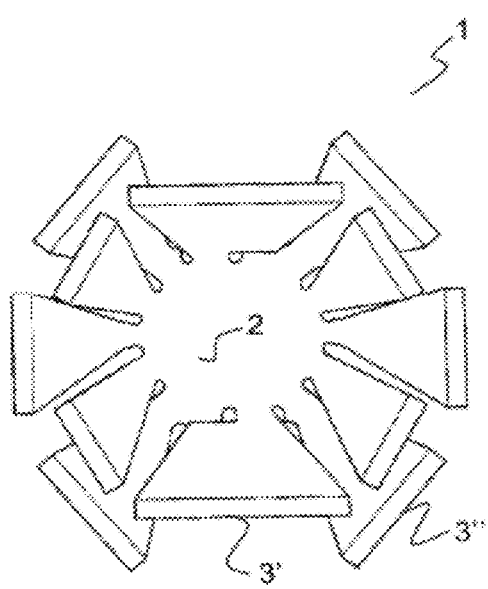
Figure 1H:
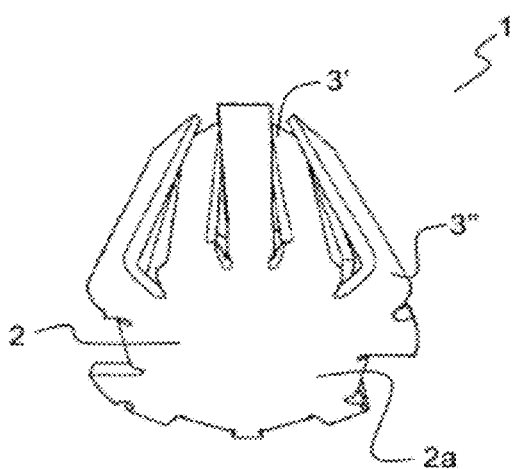

As seen in FIGS. 1(b) and (c), a first group of six non-adjacent fins 3' are being bent by an angle of approximately 90° and along the circle 4' whereas a second group of six non-adjacent fins 3" is kept in the plane of the base element 2. FIG. 1d shows fins 3' after bending along the circle 4'. FIG. 1 e to h represent the heat sink 1 after bending the second group of fins 3" along the circle 4". It can be seen that the radial offset between the two groups of fins promote air circulation and thus the cooling thereof. The set of fins 3 forms a ring around the perimeter of the base element 2, relatively similar in terms of geometry to that represented in WO2008/135927 but having a much greater density of fins each having a greater surface area, and being further produced at a much lower cost using the method according to the present invention. In FIG. 1 e in particular, it can clearly be seen that the surfaces of the fins 3 (3' and 3") in contact with the base element 2 are secant with respect to the circles 4' and 4", respectively. Said surfaces may also be tangential to said circles. The base element 2 may have dimensions suitable for receiving a single electronic component, or a plurality. It generally comprises a plane cross-section for providing an optimal thermal contact with the electronic component, but, depending on the applications, the base element may equally have a three-dimensional geometry.

Figure 4:
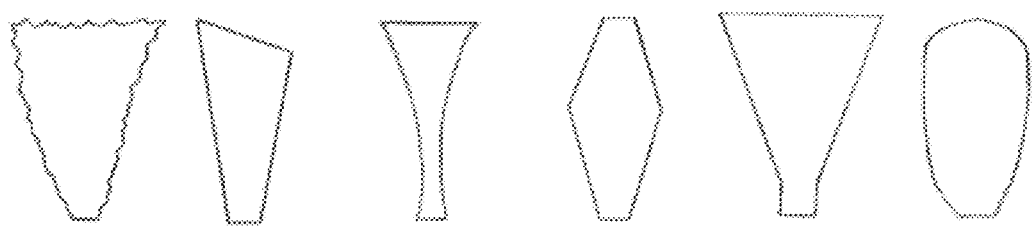
FIG. 4: shows embodiments of the fin shape of the heat sink according to the invention.

According to the invention, the fins 3 have a trapezoidal shape wherein the short side is in contact with the base element 2 such that triangular openings are inserted between two fins to enable air circulation (see FIG. 1). Corresponding fin embodiments can be seen in FIG. 4.

Obviously, other embodiments may be used. For example the side edges of the fins are not necessarily straight and may comprise at least one curved cross-section. Similarly, openings may be arranged along the fins to promote air circulation and reduce the thermal mass of the heat sink.

Moreover, the fins may have the upper portion thereof bent inwards or outwards in order to reduce the size thereof and thus increase the capacity of the heat sink per unit of volume.

The fins may be bent manually, but it is advantageous to use a tool comprising a cavity having a suitable geometry, position the plate cut in a star shape on top thereof and, using a piston, depress the centre of the star forming the base element (2) at the bottom of the cavity and thus raise the fins (3) to the desired angle. The fin bending angle is preferably between 0 and 120 degrees, and more preferably between 30 and 90°, the choice of the angle being frequently determined by the geometric configuration of the location where the electronic component is to be positioned. A 90 degree angle enables the reversible insertion of the device in a cylindrical chamber. This type of configuration is frequently found in the case of LED lights. However, if permitted by the component mounting mode, an angle less than 90 degrees makes it possible to release heat more efficiently since each fin is separated from the adjacent fins thereof and is no longer subjected to the heat thereof. An angle greater than 90°, although it brings the fins closer together, may facilitate for example the passage of a power supply cable to the component to be cooled. An angle less than 30°, even though it is less favourable in terms of air circulation (natural convection), may nonetheless offer an aesthetic benefit.

In addition to the fins 3, further cooling means may be provided in identical or different orientations with respect to the fins 3.

The method according to the invention may comprise, after the base element 2 and fins 3 have been cut in the thin plate, the following steps:

distributing the fins 3 in n groups of non-adjacent fins, n being an integer greater than or equal to 2;

bending the fins 3 in sequence by group outwards from the plane of the plate, first those of a first group 3' along a first ellipse 4', then the fins from a second group 3" along a second concentric ellipse 4" outside the first, and finally the fins from an nth group along an nth concentric ellipse outside the preceding ellipse.

This embodiment of the method can be seen in FIG. 1a to h, wherein the ellipses are circles and n is equal to 2.

After bending, the fins may further be twisted to be positioned in the desired configuration.

This production method enables automation of the method for manufacturing the heat sinks according to the present invention and makes it possible to achieve production rates greater than the majority of the heat sink production methods according to the prior art. Furthermore, the tools required for this operation are much less expensive than casting moulds.

The electronic component, from which the heat generated during the use thereof is to be discharged, may be integrated in the first main surface 2a of the base element 2 by any means known to those skilled in the art, whereas the contact provides enough heat conduction so that the heat generated is transferred to the heat sink. For example, the electronic component may be glued with suitable high heat conduction adhesives. Alternatively, the component may be attached to the base element 2 by welding or soldering, by screws, by laser or any other known technique, take care not to damage the electronic component by excessive heating during attachment.

Any electronic or electrical component requiring the discharge of the heat generated by the specific use thereof may be attached to the heat sink according to the present invention, in particular, semiconductors used as microprocessors in computers or machines of any type. One field of application in which the heat sink according to the present invention is of particular interest is the field of LED lights. Failing special measures to discharge the heat generated by an LED during the use thereof, the LED temperature may reach temperatures greater than 100° C., causing irreversible damage to the LED and reducing the service life thereof considerably.

Example 1

Figure 2:
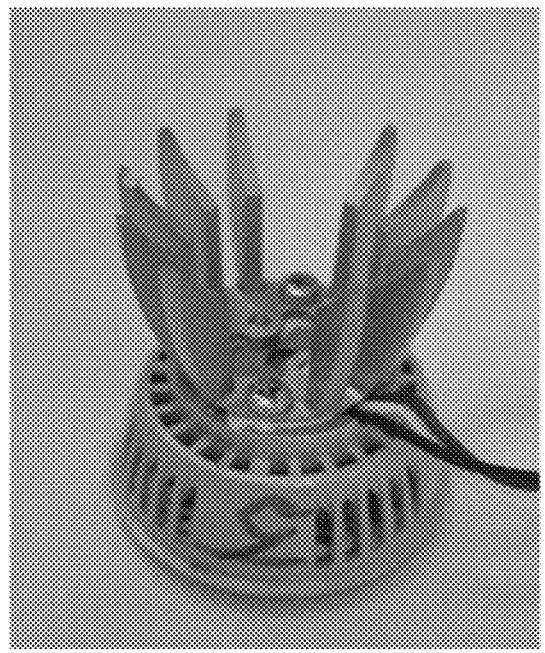
FIG. 2: (a) LED spotlight mounted on a heat sink according to the prior art; and (b) the same spotlight mounted on a heat sink according to the invention, used for the comparative example.
Figure 2:
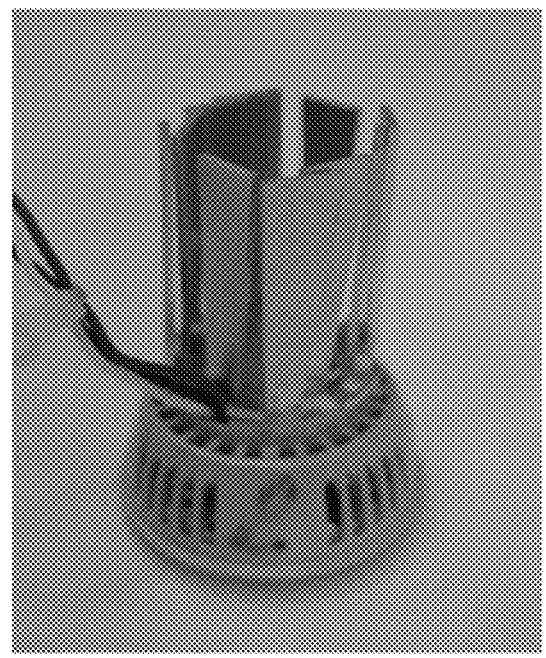
Figure 3:
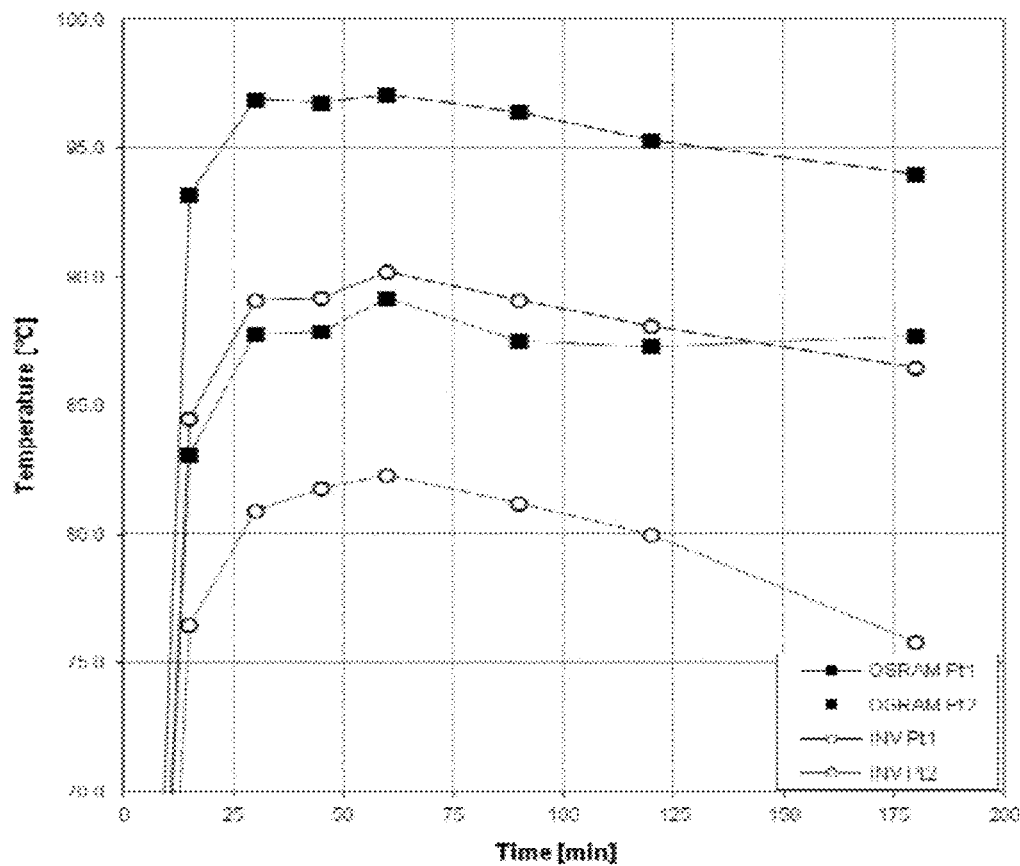
FIG. 3: graphic representation of the temperature as a function of the time measures on LED spotlights mounted on a heat sink according to the present invention and the prior art.

Two COINlight-OSTAR CO06A spotlights marketed by OSRAM were tested as follows. The first spotlight, referenced "OSRAM", is connected to the mains and is mounted on the original heat sink supplied with the spotlight at the time of purchase (see FIG. 2(a)). The second spotlight, referenced "INV", is connected to the main by the same power supply (OSRAM OT75/220-240/24) as the "OSRAM" spotlight and comprises a heat sink according to the present invention, as represented in FIGS. 1(a) and 2(b). The temperature was measured using thermocouples positioned as two points on each spotlight: at the point Pt1, situated in contact with the LED module, and at the point Pt2, situated between the venting grooves, just above the second surface (2b) of the base element 2. The test was conducted in a veranda between 1 pm and 4 pm and the ambient temperature was measured 50 cm in front of the spotlights. The results of this test is given in the table below and represented graphically in FIG. 3.

It is observed that the temperature at the points Pt1 and Pt2 is approximately 7.5° C. lower with a heat sink according to the present invention than with the original heat sink of the spotlights tested and, above all, that the maximum temperature reached on the LED (Pt1) with the heat sink according to the present invention barely exceeds 90° C., whereas, with the original heat sink, a temperature of 97.1° C. is reached, with a temperature greater than 95° C. for more than an hour and a half. This substantial reduction in the temperature makes it possible to extend the service life of the spotlights considerably.

Example 2

A heat sink according to the invention was compared to a heat sink according to the prior art having rectangular fins of the same height bent around a base element having an equivalent surface area, in terms of the exchange surface area thereof. That of the heat sink according to the invention was in the region of 60% greater.

It can thus be concluded that a heat sink according to the present invention includes the following advantages:
  high heat discharge efficiency, which increases the service life of an electronic component considerably;
  highly compact design of the heat sink due to the high dissipation capacity per unit of volume of the heat sink;
  lightness of the heat sink, giving rise to sizable savings in terms of materials;
  starting material in the form of thin plates available for sale at an inexpensive price and with no limitations in terms of quantity;
  simple, inexpensive, production method, not requiring particularly costly equipment and suitable for both large and small production volumes;
  allows considerable freedom in the heat sink design, according to the desired application and the spatial constraints to be observed.
  Makes it possible to prevent air bubbles, which are heat insulating by nature, present in the majority of moulded or extruded aluminium components.

The invention claimed is:
1. Heat sink for an electronic or electrical component, comprising:
  a base element comprising a first main surface suitable for receiving the electronic or electrical component in close thermal contact;
  a plurality of elongate fins projecting outwards from a second main surface of the base element, opposite the first surface, and arranged around the entire periphery of the base element with enough space between fins to allow air circulation,
characterised in that:
  the fins being further arranged according to at least two concentric regular geometric figures with the main sur-

|  | | temperature (° C.) | | | | | |
|---|---|---|---|---|---|---|---|
| time | | Pt1 | | | Pt2 | | |
| [min] | ambient | OSRAM | INV | INV − OSRAM | OSRAM | INV | INV − OSRAM |
| 15 | 32.1 | 93.2 | 84.5 | −8.7 | 83.1 | 76.5 | −6.6 |
| 30 | 33.2 | 96.9 | 89.1 | −7.8 | 87.8 | 80.9 | −6.9 |
| 45 | 38.9 | 96.8 | 89.2 | −7.6 | 87.9 | 81.8 | −6.1 |
| 60 | 41.2 | 97.1 | 90.2 | −6.9 | 89.2 | 82.3 | −6.9 |
| 90 | 38.5 | 96.4 | 89.1 | −7.3 | 87.5 | 81.2 | −6.3 |
| 120 | 35.2 | 95.3 | 88.1 | −7.2 | 87.3 | 80 | −7.3 |
| 180 | 33.3 | 94.0 | 86.5 | −7.5 | 87.7 | 75.8 | −11.9 |
| mean | 36.1 | 95.7 | 88.1 | −7.6 | 87.2 | 79.8 | −7.4 | faces of the fins being secant or substantially tangent with respect to said geometric figures;

the fins have a trapezoidal shape with a long side and a short side, wherein the short side of the fins are in contact with said base element; and in that said base element and said fins being formed from a thin plate having a cut in the form of a geometric shape corresponding to said base element and said fins; and the fins are bent relative to the plane of the base element.

2. Heat sink according claim 1, characterised in that the fins are bent along an angle in the range of 0° to 120°.

3. Heat sink according to claim 2, characterised in that said angle is in the range of 30° to 90°.

4. Heat sink according to claim 1, characterised in that it can be obtained by twisting the fins after bending.

5. Heat sink according to claim 1, characterised in that said at least two concentric regular geometric figures are ellipses or circles.

6. Heat sink according to claim 1, characterised in that said at least two concentric regular geometric figures are polygons.

7. Heat sink according to claim 1, characterised in that an upper portion of the fins is bent inwards or outwards.

8. Heat sink according to claim 1, characterised in that the thin plate is produced by rolling.

9. Heat sink according to claim 1, characterised in that the thin plate consists of aluminium, tungsten, titanium, or copper.

10. Heat sink according to claim 1, further comprising an electronic or electrical component in close thermal contact with the first main surface of the base element, said electronic component being selected from semiconductors and light-emitting diodes, and the electrical component being selected from transformers and current variators.

11. Method for manufacturing a heat sink for electronic or electrical components, comprising the following steps:

cutting a geometric shape corresponding to a base element and a plurality of elongate fins having a trapezoidal shape wherein the short side of the trapezoidal shaped fins are in contact with said base element in a thin plate;

bending the fins outside the plane of the plate, such that the fins are arranged according to at least two concentric regular geometric figures around the entire periphery of the base element with enough space between fins to allow air circulation.

12. Method according to claim 11, characterised in that the fins are bent along an angle in the range of 0° to 120°.

13. Method according to claim 12, characterised in that said angle is in the range of 30° to 90°.

14. Method according to claim 11, characterised in that the method comprises, after cutting said geometric shapes in the thin plate, the following steps:

distributing the fins in n groups of non-adjacent fins, n being an integer greater than or equal to 2;

bending the fins in sequence by group outwards from the plane of the plate, first those of a first group along a first ellipse, then the fins from a second group along a second concentric ellipse outside the first, and finally the fins from an nth group along an nth concentric ellipse outside the preceding ellipse.

15. Method according to claim 14, characterised in that n is equal to 2.

16. Method according to claim 14, characterised in that the ellipses are circles.

17. Method according to claim 11, characterised in that it comprises the step for twisting the fins after bending.

18. Method according to claim 11, characterised in that the cutting step is performed by stamping, a laser beam or photochemical machining.

19. Method according to claim 11, characterised in that the bending step is performed by positioning the cut plate above a cavity having the desired geometry and stamping in said cavity using a piston to depress the base element to the bottom of the cavity and thus raise the fins to the desired angle.

20. Heat sink according to claim 10, characterised in that said electronic component comprises a microprocessor.

\* \* \* \* \*